United States Patent
Sato

(10) Patent No.: US 9,035,377 B2
(45) Date of Patent: May 19, 2015

(54) SEMICONDUCTOR DEVICE

(71) Applicant: Kabushiki Kaisha Toshiba, Minato-ku, Tokyo (JP)

(72) Inventor: Shinya Sato, Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/215,294

(22) Filed: Mar. 17, 2014

(65) Prior Publication Data

US 2015/0076589 A1   Mar. 19, 2015

(30) Foreign Application Priority Data

Sep. 13, 2013   (JP) .................................. 2013-191130

(51) Int. Cl.
| | | |
|---|---|---|
| H01L 29/94 | (2006.01) | |
| H01L 29/78 | (2006.01) | |
| H01L 29/10 | (2006.01) | |

(52) U.S. Cl.
CPC ........ *H01L 29/7802* (2013.01); *H01L 29/1045* (2013.01); *H01L 29/105* (2013.01)

(58) Field of Classification Search
USPC .................. 257/328, 329, 335, 341, E29.257, 257/E29.262
See application file for complete search history.

(56) References Cited

U.S. PATENT DOCUMENTS

| | | | |
|---|---|---|---|
| 7,714,385 B2 | 5/2010 | Tokano et al. | |
| 7,799,640 B2 * | 9/2010 | Parsey et al. | ................... 438/268 |
| 8,097,501 B2 | 1/2012 | Sakuma et al. | |
| 2010/0059815 A1 * | 3/2010 | Grivna et al. | ................. 257/330 |
| 2011/0169081 A1 | 7/2011 | Ishikawa et al. | |
| 2014/0327069 A1 * | 11/2014 | Willmeroth et al. | .......... 257/329 |

FOREIGN PATENT DOCUMENTS

| | | |
|---|---|---|
| JP | 2007-173734 A | 7/2007 |
| JP | 2010-182881 A | 8/2010 |
| JP | 2011-142269 A | 7/2011 |

* cited by examiner

*Primary Examiner* — Matthew E Warren
(74) *Attorney, Agent, or Firm* — White & Case LLP

(57) ABSTRACT

A semiconductor device of an embodiment has a first conductive type first semiconductor layer, a second conductive type second semiconductor layer provided in the first semiconductor layer having a first lateral surface and a first bottom portion contacting the first semiconductor layer. The second semiconductor layer has a first void portion inside. A second conductive type impurity concentration decreases from the first lateral surface toward the first void portion. And the device has a second conductive type third semiconductor layer provided in the first semiconductor layer such that the first semiconductor layer is sandwiched between the third semiconductor layer and the second semiconductor layer. The third semiconductor layer has a second lateral surface and a second bottom portion contacting the first semiconductor layer. The third semiconductor layer has a second void portion inside. A second conductive type impurity concentration decreases from the second lateral surface toward the second void portion.

10 Claims, 10 Drawing Sheets

SEMICONDUCTOR DEVICE

CROSS-REFERENCE TO RELATED APPLICATION

This application is based upon and claims the benefit of priority from Japanese Patent Application No. 2013-191130, filed on Sep. 13, 2013, the entire contents of which are incorporated herein by reference.

FIELD

Embodiments described herein relate generally to a semiconductor device.

BACKGROUND

A power control semiconductor device achieves both of high breakdown voltage and low on resistance. One example of such a device is a vertical MOSFET (Metal Oxide Semiconductor Field Effect Transistor) having a super junction structure (also referred to as a "SJ structure") in which p-type (or n-type) semiconductor layers are buried in n-type (or p-type) semiconductor layers and n-type regions and p-type regions are alternately placed. In the SJ structure, an n-type impurity amount included in the n-type region and a p-type impurity amount included in the p-type region are made equal to form pseudo non-doped regions and achieve high breakdown voltage. At the same time, it is possible to achieve low on resistance by conducting electric current in a high concentration impurity region.

One method of forming the SJ structure includes a method of, for example, forming trenches in n-type semiconductor layers and burying the p-type semiconductors in these trenches to provide p-type semiconductor layers. However, according to this method, void portions (voids) are likely to be formed in the p-type semiconductor layers.

DETAILED DESCRIPTION

Figure 1:
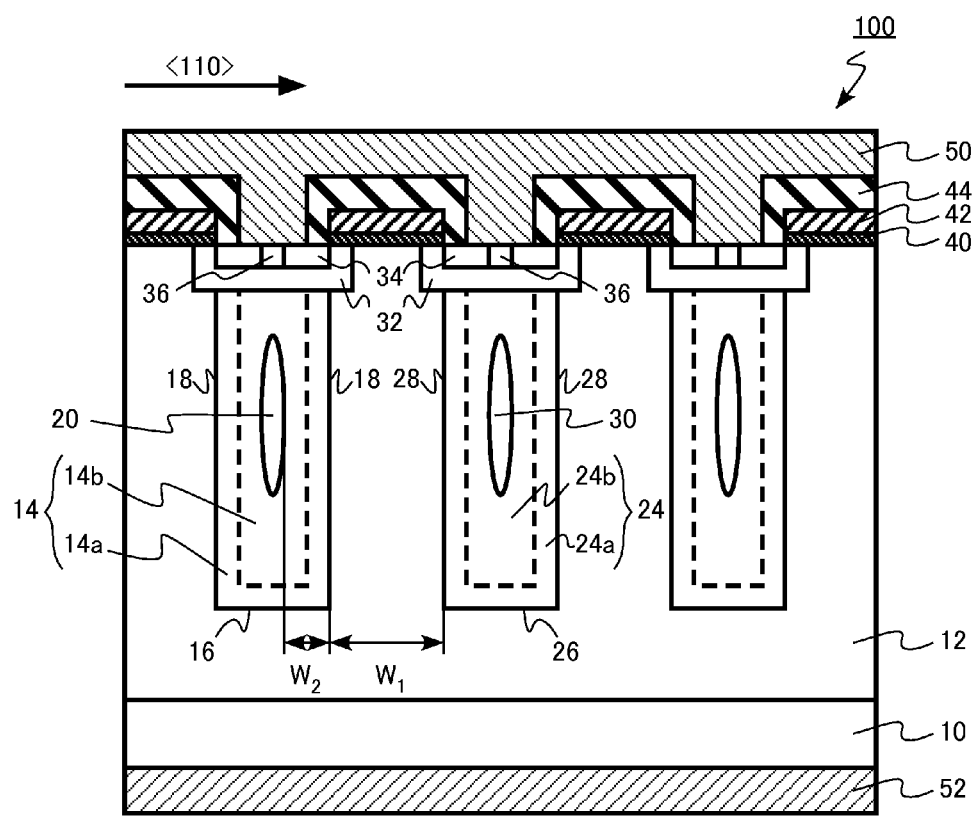
FIG. 1 is a schematic cross-sectional view of a semiconductor device according to a first embodiment.

A semiconductor device of an embodiment has a first conductive type first semiconductor layer, a second conductive type second semiconductor layer provided in the first semiconductor layer having a first lateral surface and a first bottom portion contacting the first semiconductor layer. The second semiconductor layer has a first void portion inside. A second conductive type impurity concentration decreases from the first lateral surface toward the first void portion. And the device has a second conductive type third semiconductor layer provided in the first semiconductor layer such that the first semiconductor layer is sandwiched between the third semiconductor layer and the second semiconductor layer. The third semiconductor layer has a second lateral surface and a second bottom portion contacting the first semiconductor layer. The third semiconductor layer has a second void portion inside. A second conductive type impurity concentration decreases from the second lateral surface toward the second void portion.

Hereinafter, embodiments will be described with reference to the drawings. In addition, in the following description, the same reference numerals will be assigned to the same members and the members which are described once will not be described again.

First Embodiment

A semiconductor device according to the present embodiment has a first conductive type first semiconductor layer and a second conductive type second semiconductor layer which is provided in the first semiconductor layer. The second semiconductor layer has a first lateral surface and a first bottom portion which contact the first semiconductor layer. The second semiconductor layer has a first void portion inside. And in the second semiconductor layer, a second conductive type impurity concentration decreases from the first lateral surface toward the first void portion. Further, the semiconductor device has a second conductive type third semiconductor layer which is provided in the first semiconductor layer such that the first semiconductor layer is sandwiched between the third semiconductor layer and the second semiconductor layer. The third semiconductor layer has a second lateral surface and a second bottom portion which contact the first semiconductor layer. The third semiconductor layer has a second void portion inside. In the third semiconductor layer, a second conductive type impurity concentration decreases from the second lateral surface toward the second void portion.

FIG. 1 is a schematic cross-sectional view of the semiconductor device according to the present embodiment. A semiconductor device 100 according to the present embodiment is a vertical MOSFET which adopts a super junction structure. A case where a first conductive type is an n-type and a second conductive type is a p-type will be described as an example. Further, first conductive type impurity concentrations become lower in order of an $n^+$-type, an n-type and an $n^-$-type. Similarly, second conductive type impurity concentrations become lower in order of a $p^+$-type, a p-type and a $p^-$-type.

The semiconductor device (MOSFET) 100 according to the present embodiment has an $n^-$-type semiconductor layer (first semiconductor layer) 12 on an n-type substrate 10. The n-type substrate 10 and the $n^-$-type semiconductor layer 12 are of, for example, single-crystal silicon containing n-type impurity. The n-type impurity concentration of the $n^-$-type semiconductor layer 12 is lower than the n-type impurity concentration of the n-type substrate 10. The n-type impurity is, for example, phosphorus (P) or arsenic (As).

The n-type substrate 10 functions as a drain region of the MOSFET 100. Further, the n-type semiconductor layer 12 functions as a drift region of the MOSFET 100.

A plurality of p-type semiconductor layers (second semiconductor layers) 14 is provided to extend in the n⁻-type semiconductor layer 12. The p-type semiconductor layer 14 is of, for example, single-crystal silicon containing the p-type impurity. The p-type impurity is, for example, boron (B).

The p-type semiconductor layer 14 has a bottom portion (first bottom portion) 16 and two lateral surfaces (first lateral surfaces) 18 which contact the n⁻-type semiconductor layer 12. Further, the p-type semiconductor layer 14 has avoid portion (first void portion) 20 inside.

The p-type semiconductor layer 14 has a high concentration impurity region 14a around the bottom portion 16 and the lateral surfaces 18, and a low concentration impurity region 14b around the void portion 20. The low concentration impurity region 14b has a lower p-type impurity concentration than that of the high concentration impurity region 14a.

The high concentration impurity region 14a and the low concentration impurity region 14b are provided, so that the p-type impurity concentration of the p-type semiconductor layer 14 decreases from the lateral surfaces (first lateral surfaces) 18 toward the void portion (first void portion) 20. The void portion 20 is surrounded by the low concentration impurity region 14b.

The low concentration impurity region 14b may be an i-type, that is, non-doped semiconductor layer. Further, the low concentration impurity region 14b may be an n-type semiconductor layer. Furthermore, a change of the p-type impurity concentration between the high concentration impurity region 14a and the low concentration impurity region 14b may be discontinuous or continuous.

The p-type impurity concentration of the low concentration impurity region 14b is desirably one digit or more lower and is more desirably two digits or more lower than that of the high concentration impurity region 14a. When the difference between the p-type impurity concentrations of the low concentration impurity region 14b and the high concentration impurity region 14a is more significant, the SJ structure is less susceptible to a change of characteristics accompanied by deformation due to migration of the void portion 20.

A plurality of p-type semiconductor layers (third semiconductor layers) 24 is provided to extend in the n⁻-type semiconductor layer 12 such that the n⁻-type semiconductor layer 12 is positioned between a plurality of p-type semiconductor layers 24 and the p-type semiconductor layers 14. The p-type semiconductor layer 24 is of, for example, single-crystal silicon containing the p-type impurity. The p-type impurity is, for example, boron (B).

The p-type semiconductor layer 24 has a bottom portion (second bottom portion) 26 and two lateral surfaces (second lateral surfaces) 28 which contact the n⁻-type semiconductor layer 12. Further, the p-type semiconductor layer 24 has a void portion (second void portion) 30 inside.

The p-type semiconductor layer 24 has a high concentration impurity region 24a around the bottom portion 26 and the lateral surfaces 28 and a low concentration impurity region 24b around the void portion 30. The low concentration impurity region 24b has a lower p-type impurity concentration than that of the high concentration impurity region 24a.

The high concentration impurity region 24a and the low concentration impurity region 24b are provided, so that the p-type impurity concentration of the p-type semiconductor layer 24 decreases from the lateral surfaces (second lateral surfaces) 28 toward the void portion (second void portion) 30. The void portion 30 is surrounded by the low concentration impurity region 24b.

The low concentration impurity region 24b may be an i-type, that is, non-doped semiconductor layer. Further, the low concentration impurity region 24b may be an n-type semiconductor layer. Furthermore, a change of the p-type impurity concentration between the high concentration impurity region 24a and the low concentration impurity region 24b may be continuous.

The p-type impurity concentration of the low concentration impurity region 24b is desirably one digit or more lower than and more desirably two digits or more lower than that of the high concentration impurity region 24a. When a difference between the p-type impurity concentrations of the low concentration impurity region 24b and the high concentration impurity region 24a is more significant, the SJ structure is less susceptible to a change of characteristics accompanied by deformation due to migration of the second void portion 30.

In the semiconductor device 100 according to the present embodiment, a plurality of p-type semiconductor layers including the p-type semiconductor layers 14 and the p-type semiconductor layers 24 is aligned and arranged in the n⁻-type semiconductor layer 12 to form the SJ structure. The p-type semiconductor layers are aligned and arranged in a <110> direction.

Further, the p-type semiconductor layers 14 and the p-type semiconductor layers 24 have shapes which extends toward the depth side in FIG. 1 (direction vertical to FIG. 1 plane) when seen from the surface side of the n⁻-type semiconductor layer 12, and the respective p-type semiconductor layers 14 and the p-type semiconductor layer 24 are arranged in parallel on planes parallel to the surface of the n⁻-type semiconductor layer 12. In other words, a extending direction (longitudinal direction) of the p-type semiconductor layer 14 and the p-type semiconductor layer 24 on the planes parallel to the surface of the n⁻-type semiconductor layer 12 is the <110> direction. According to the present embodiment, a plane direction of the first and second lateral surfaces 18 and 28 is a plane close to a {110} plane.

When a distance between the p-type semiconductor layer 14 and the p⁻ type semiconductor layer 24 is $W_1$, an n-type impurity concentration of the n⁻-type semiconductor layer 12 is $N_1$, a distance from the first lateral surface 18 to the first void portion 20 is $W_2$ and a p-type impurity concentration of the second semiconductor 14 is $N_2$, a relationship of $0.7 \leq W_1 N_1 / W_2 N_2 \leq 1.3$ is desirably satisfied.

When the above relationship is satisfied, the p-type semiconductor layers and the n-type semiconductor layers which are alternately arranged form a pseudo and nearly non-doped region, so that it is possible to achieve higher breakdown voltage. In addition, the p-type impurity concentration $N_2$ is an average concentration of the second semiconductor layer 14 between the first lateral surfaces 18 and the first void portion 20. The average concentration is determined by measuring impurity concentrations at a plurality of points and calculating an average value.

P-type semiconductor regions (fourth semiconductor layers) 32 are provided on the surface of the n⁻-type semiconductor layer 12 to connect the p-type semiconductor layer 14 and the p-type semiconductor layer 24. Further, two n-type semiconductor regions (fifth semiconductor layers) 34 are provided on the surface of the p-type semiconductor region 32, and p-type semiconductor regions (sixth semiconductor layers) 36 are provided between the neighboring n-type semiconductor regions 34.

The n-type impurity concentration of the n-type semiconductor region 34 is higher than the n-type impurity concentration of the n⁻-type semiconductor layer 12. Further, the p-type impurity concentration of the p⁺-type semiconductor region 36 is higher than the p-type impurity concentrations of the p-type semiconductor layer 14, the p-type semiconductor layer 24 and the p-type semiconductor region 32.

The p-type semiconductor region 32 functions as a channel region (base region) of the MOSFET 100. The n-type semiconductor region 34 functions as a source region of the MOSFET 100 and the p$^+$-type semiconductor region 36 functions as a channel contact region (base contact region) of the MOSFET 100.

A gate insulating film 40 is provided on the n$^-$-type semiconductor layer 12 sandwiched between the p-type semiconductor region 32 and the p-type semiconductor region 32. Further, a gate electrode 42 is provided on the gate insulating film 40. An inter-layer insulation film 44 is provided on the gate electrode 42.

The gate insulating film 40 is, for example, a silicon oxide film. The gate electrode 42 is of, for example, polycrystal silicon containing an n-type impurity. Further, the inter-layer insulation film 44 is, for example, a silicon oxide film.

A first electrode 50 is provided on the n-type semiconductor regions 34 and the p$^+$-type semiconductor regions 36. The first electrode 50 is a source electrode of the MOSFET 100. The first electrode 50 is of, for example, metal.

A second electrode 52 is provided on a surface of the n-type substrate 10 on a side opposite to the n$^-$-type semiconductor layer 12. The second electrode 52 is a drain electrode of the MOSFET 100. The second electrode 52 is of, for example, metal.

Next, an example of a method of manufacturing a semiconductor device according to the present embodiment will be described. FIGS. 2 to 5 are views illustrating the method of manufacturing the semiconductor device according to the present embodiment.

The n$^-$-type semiconductor layer 12 of single-crystal silicon containing the n-type impurity is formed on the surface of the substrate 10 of single-crystal silicon containing the n-type impurity by an epitaxial growth method.

Next, for example, a mask member 60 of a silicon oxide film is formed on the n$^-$-type semiconductor layer 12. The mask member 60 is formed by deposition of films byway of CVD (Chemical Vapor Deposition), lithography and RIE (Reactive Ion Etching).

Figure 2:
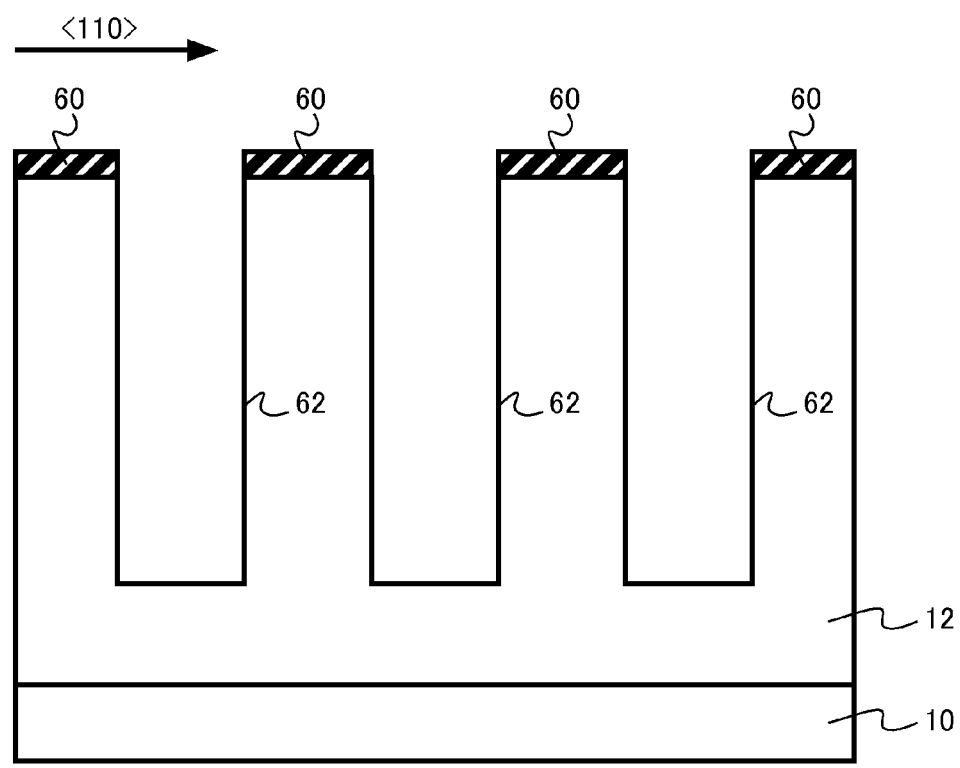
FIG. 2 is a view illustrating a method of manufacturing the semiconductor device according to the first embodiment.

Next, the n$^-$-type semiconductor layer 12 is etched using the mask member 60 as a mask to form trenches 62 (FIG. 2). Etching is performed by, for example, RIE.

Figure 3:
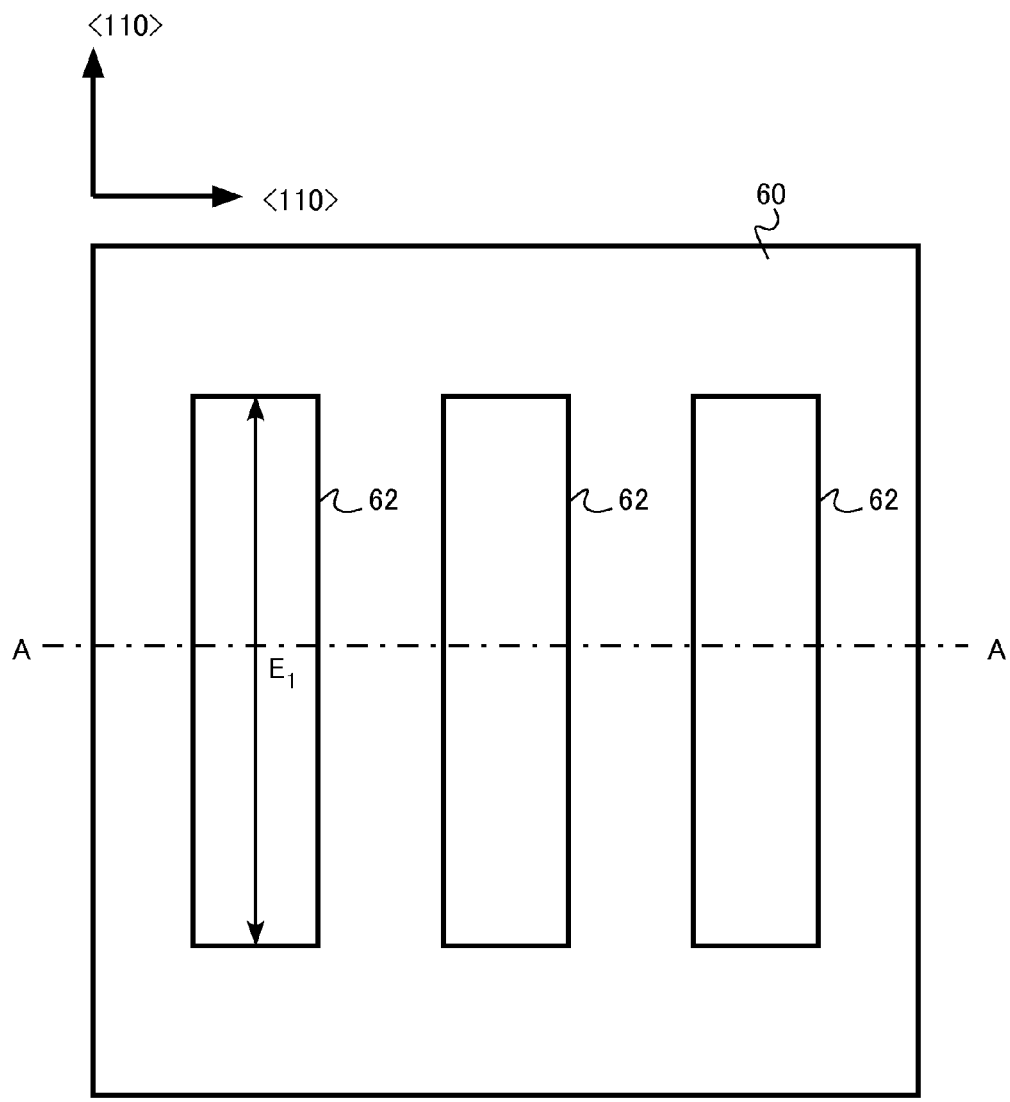
FIG. 3 is a view illustrating the method of manufacturing the semiconductor device according to the first embodiment.

FIG. 3 is a top view illustrating the state in FIG. 2. FIG. 2 corresponds to an AA cross section of FIG. 3. A extending direction (longitudinal direction: an E$_1$ direction in FIG. 3) of the trenches 62 is the <110> direction. In other words, a lateral surface parallel to the extending direction of the trenches 62 is the {110} plane.

Figure 4:
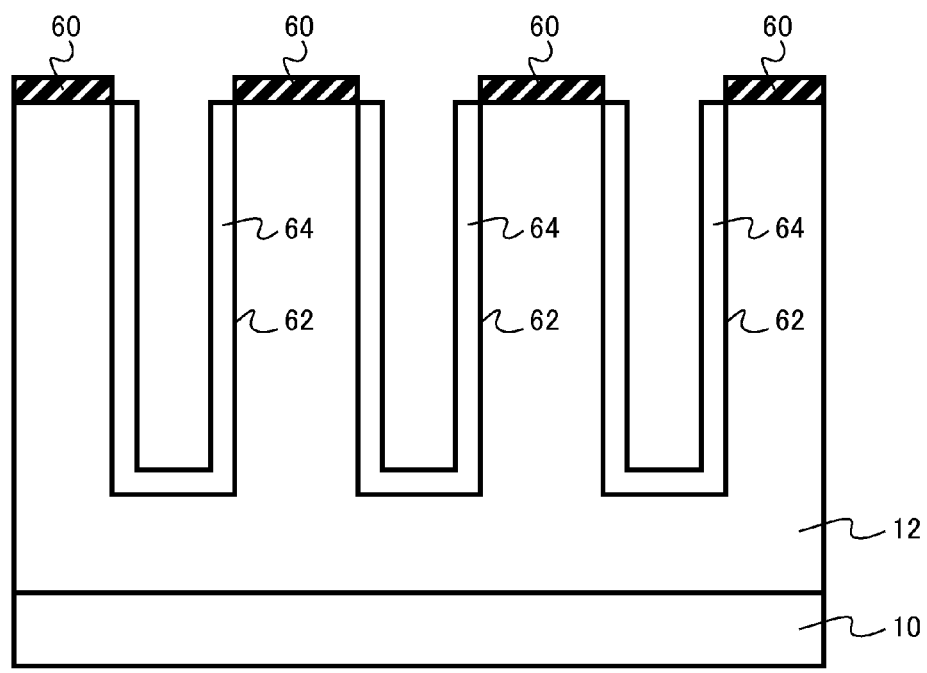
FIG. 4 is a view illustrating the method of manufacturing the semiconductor device according to the first embodiment.

Next, first semiconductor films 64 containing the p-type impurity are formed in the trenches 62 by the epitaxial growth method to have such a thickness that the trenches 62 are not filled (FIG. 4). The first semiconductor film 64 is of, for example, single-crystal silicon containing the p-type impurity.

Figure 5:
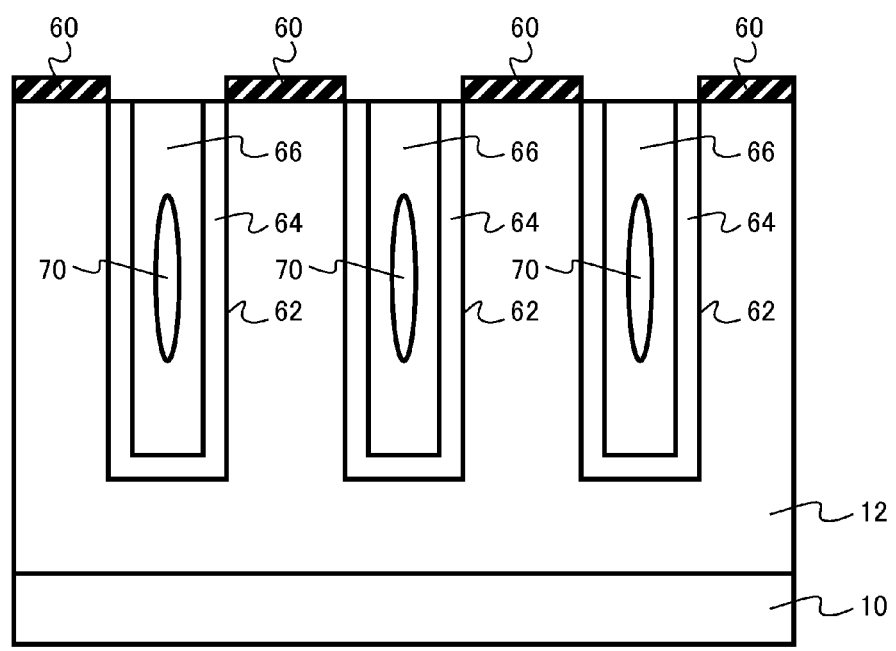
FIG. 5 is a view illustrating the method of manufacturing the semiconductor device according to the first embodiment.

Next, second semiconductor films 66 are formed on the first semiconductor films 64 by the epitaxial growth method such that the trenches 62 are filled and void portions (voids) 70 are formed (FIG. 5). The second semiconductor film 66 is a film which has a lower p-type impurity concentration than that of the first semiconductor film 64. The second semiconductor film 66 is of, for example, non-doped single-crystal silicon.

The first semiconductor films 64 and the second semiconductor films 66 are formed by, for example, CVD. CVD conditions include that, for example, source gas is dichlorosilane (DCS:SiH$_2$Cl$_2$) and hydrochloric acid (HCl), a temperature is 950° C. to 1100° C. and a pressure is reduced to 1 Pa to 40 kPa. For example, silicon source gas such as silane (SiH$_4$), dichlorosilane (DCS) and trichlorosilane (TCS:SiHCl$_3$) or a combination of these silicon source gases and halogen gas such as hydrochloric acid (HCl) and chlorine (Cl$_2$) may be used as source gas.

Figure 6:
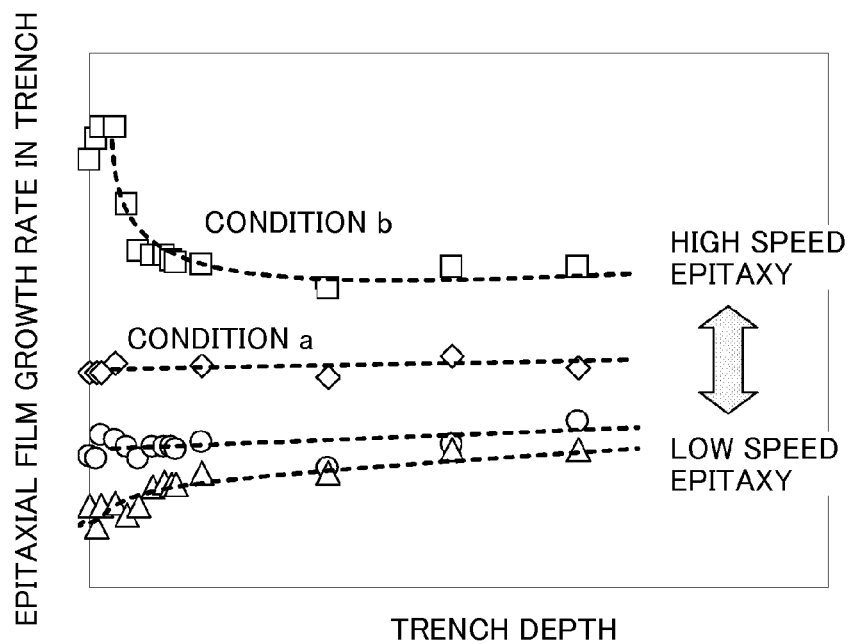
FIG. 6 is a view illustrating an example of epitaxial film growth rates in trenches.

FIG. 6 is a view illustrating an example of epitaxial film growth rates in trenches. FIG. 6 illustrates relationships between trench depths and epitaxial film growth rates in the trenches under some different epitaxial growth conditions. Each condition is, for example, a condition in which a flow rate of halogen gas is changed.

Under the conditions illustrated in FIG. 6, a condition of poor coverage in trenches, that is, a condition that voids are likely to be formed is achievable under a condition of a high film growth rate (high speed epitaxy). According to the present embodiment, for example, the first semiconductor films 64 are formed under a condition (condition a) of a comparatively low film growth rate and good coverage in FIG. 5. Subsequently, the second semiconductor films 66 are formed under a condition (condition b) of a comparatively high film growth rate and poor coverage in FIG. 5.

By this means, it is possible to intentionally form voids, control shapes of the voids, increase the film growth rates and improve productivity. In addition, the shapes of the voids can be controlled by not only controlling the epitaxial growth condition but also controlling shapes of trenches, or controlling the shapes of the trenches and controlling the epitaxial growth condition in combination.

The mask member 60 is removed off after the trenches 62 are filled. Subsequently, surfaces of the n-type semiconductor layer 12, the first semiconductor films 64 and the second semiconductor films 66 are flattened by, for example, CMP (Chemical Mechanical Polishing).

Next, the p-type semiconductor regions 32, the n-type semiconductor regions 34 and the p$^+$-type semiconductor regions 36 are formed by ion-implantation of impurities and annealing to activate the impurities. Subsequently, the gate insulating films 40 are formed by, for example, thermal oxidation.

Subsequently, the gate electrodes 42, the inter-layer insulation films 44, the first electrode 50 and the second electrode 52 are formed by a known manufacturing method to form the MOSFET 100 illustrated in FIG. 1.

In addition, the first semiconductor films 64 correspond to the high concentration impurity regions 14$a$ and 24$a$, and the second semiconductor films 66 correspond to the low concentration impurity regions 14$b$ and 24$b$. Further, the void portions 70 correspond to the void portions 20 and 30.

When there is a void portion (void) inside a semiconductor layer buried in a trench, there is a concern that annealing to activate an impurity or heat processing to form a gate insulating film by way of thermal oxidation causes surface migration and a void shape is deformed. Then, a distribution of a p-type impurity in the semiconductor layer buried in the trench changes from an intended distribution. That is, the p-type impurity is redistributed, and a balance between the p-type impurity amount and the n-type impurity amount is lost. By this means, there is a concern that an effect of the SJ structure of improving breakdown voltage weakens, and breakdown voltage deteriorates. Further, the degree of deformation of a void due to surface migration is highly likely to differ per trench or per chip. Therefore, there is a concern that MOSFET characteristics become unstable.

In the MOSFET 100 according to the present embodiment, there are the void portions (voids) 20 and 30 in the low concentration impurity regions 14b and 24b of the p-type semiconductor layers (second semiconductor layers) 14 and the p-type semiconductor layers (third semiconductor layers) 24. Hence, even when voids are deformed due to migration, only the low concentration impurity regions 14b and 24b are mainly deformed. Therefore, the distribution of the p-type impurity does not significantly change. Consequently, the distribution of the p-type impurity is maintained as designed and the MOSFET 100 of the stable characteristics is achieved.

In addition, when a concentration difference between the p-type impurity concentrations of the low concentration impurity regions 14b and 24b and the high concentration impurity regions 14a and 24a is more significant, an effect of suppressing fluctuation of characteristics due to a redistribution of the p-type impurity increases.

Second Embodiment

A semiconductor device according to the present embodiment is the same as that of the first embodiment except that a extending direction of second semiconductor layers and third semiconductor layers on a plane parallel to a surface of the first semiconductor layer is a <100> direction. Hence, content which overlaps that of the first embodiment will not be described.

Figure 7:
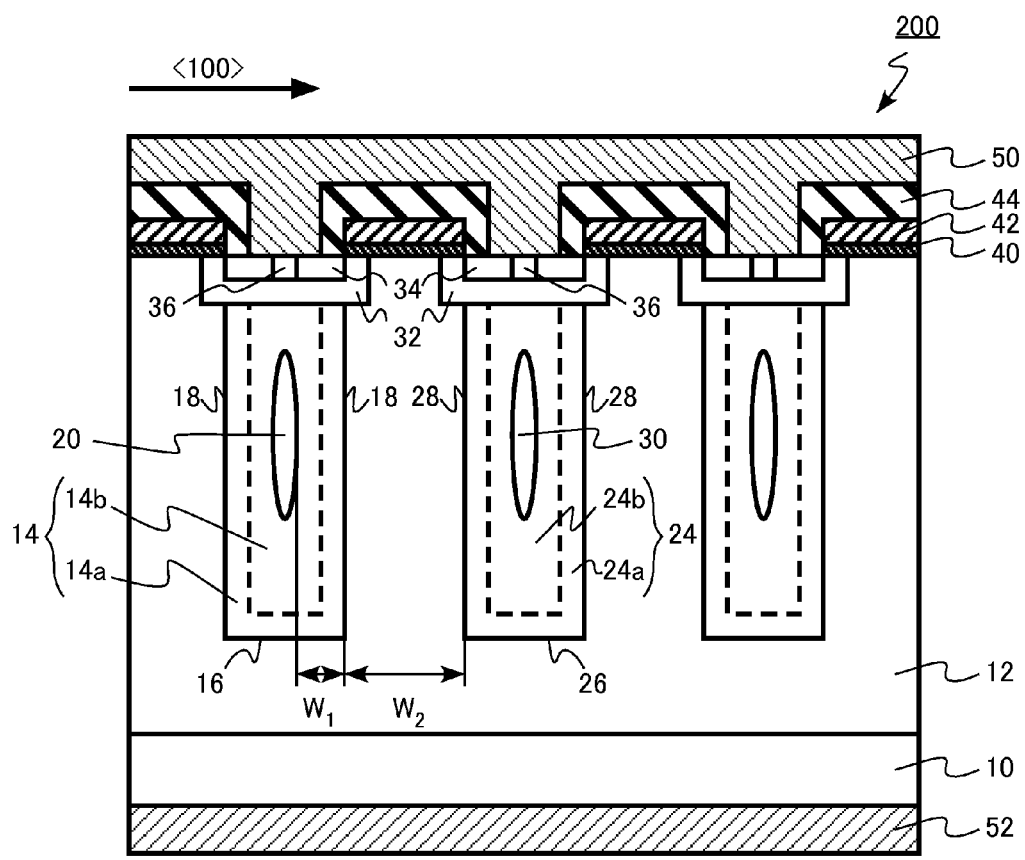
FIG. 7 is a schematic cross-sectional view of a semiconductor device according to a second embodiment.

FIG. 7 is a schematic cross-sectional view of the semiconductor device according to the present embodiment. In a semiconductor device 200 according to the present embodiment, a plurality of p-type semiconductor layers including p-type semiconductor layers (second semiconductor layers) 14 and p-type semiconductor layers (third semiconductor layers) 24 is aligned and arranged in an n-type semiconductor layer 12 to form a SJ structure. The p-type semiconductor layers are aligned and arranged in the <100> direction.

Further, the p-type semiconductor layers 14 and the p-type semiconductor layers 24 have shapes which stretch toward the depth side in FIG. 7 when seen from the surface side of the n⁻-type semiconductor layer 12, and the respective p-type semiconductor layers 14 and the p-type semiconductor layer 24 are arranged in parallel on the surface of the n-type semiconductor layer 12. In other words, a extending direction (longitudinal direction) of the p-type semiconductor layer 14 and the p-type semiconductor layer 24 on the planes parallel to the surface of the n⁻-type semiconductor layer 12 is the <100> direction. According to the present embodiment, a plane direction of first and second lateral surfaces 18 and 28 is a plane close to a {100} plane.

Figure 8:
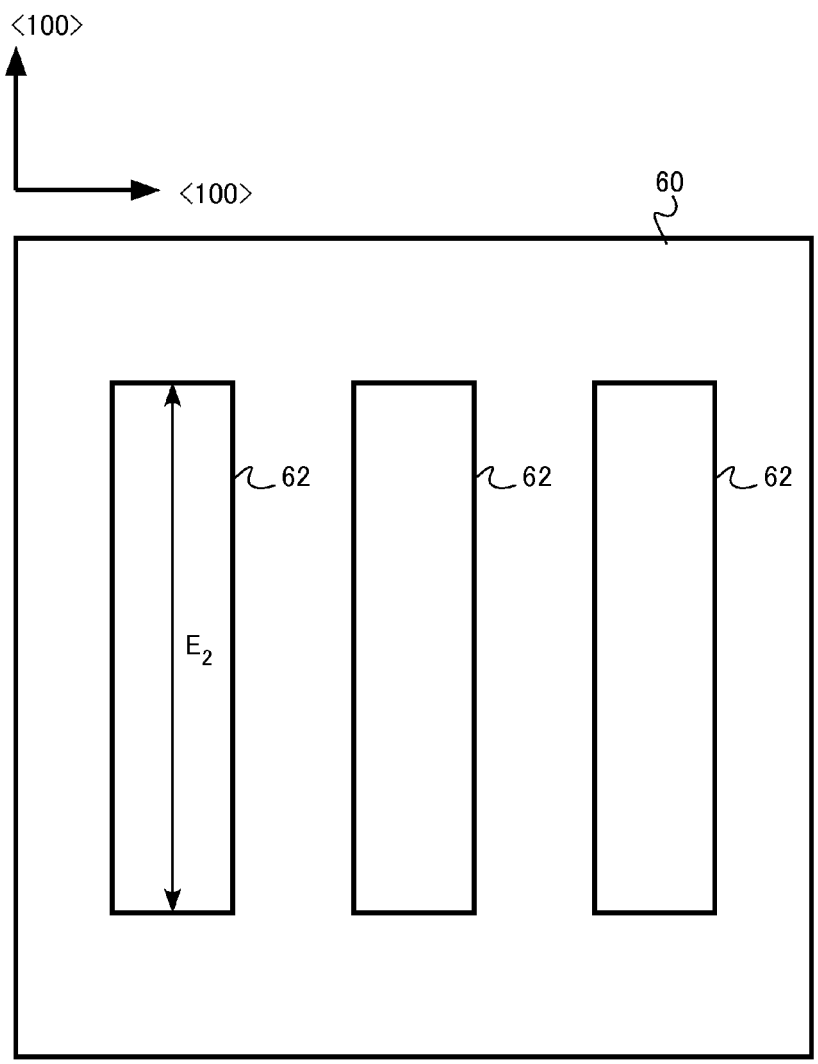
FIG. 8 is a view illustrating the method of manufacturing the semiconductor device according to the second embodiment.

FIG. 8 is a view illustrating a method of manufacturing the semiconductor device according to the present embodiment. FIG. 8 is a top view of a state in which trenches are formed. A extending direction (longitudinal direction: an $E_2$ direction in FIG. 8) of the trenches 62 is the <100> direction. In other words, a lateral surface parallel to the extending direction of the trenches 62 is a {100} plane.

The {100} plane is a stable plane in terms of energy compared to, for example, a {110} plane. When the plane direction of the first and second lateral surfaces 18 and 28 is the {100} plane, the lateral surfaces of void portions (voids) 20 and 30 become close to the {100} plane. Hence, even when heat processing is performed after voids are formed, the plane is a stable plane, and deformation due to migration hardly occurs. Consequently, the p-type impurity is hardly redistributed.

According to the present embodiment, a MOSFET 200 of more stable characteristics is achieved.

Third Embodiment

A semiconductor device according to the present embodiment differs from that of the first embodiment in that, when a distance between a first void portion and a second void portion in a direction parallel to a surface of a first semiconductor layer is D, a distance between a lower end of the first void portion and a lower end of the second void portion in a direction vertical to the surface of the first semiconductor layer is $d_1$, and a distance between an upper end of the first void portion and an upper end of the second void portion in the direction vertical to the surface of the first semiconductor layer is $d_2$, a relationship of $d_1 \leq D$ and $d_2 \leq D$ is satisfied. Hereinafter, content which overlaps that of the first embodiment will not be described.

Figure 9:
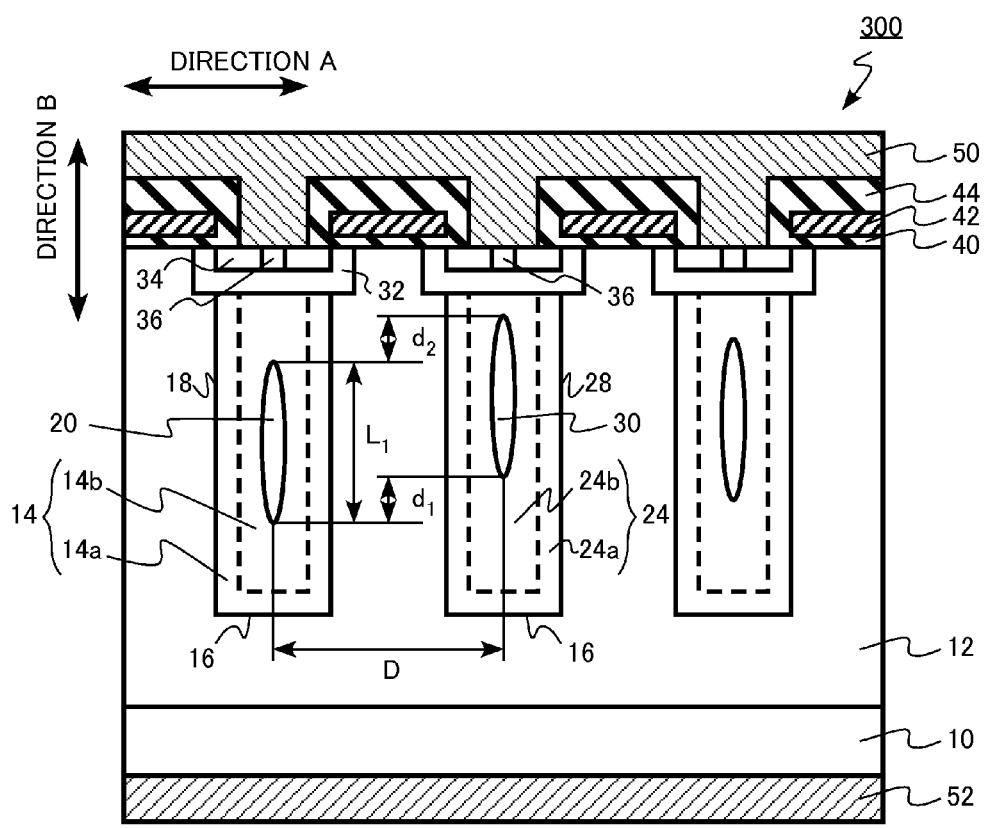
FIG. 9 is a schematic cross-sectional view of a semiconductor device according to a third embodiment.

FIG. 9 is a schematic cross-sectional view of a semiconductor device according to the present embodiment. A semiconductor device 300 according to the present embodiment is a vertical MOSFET which adopts a super junction structure. A case where a first conductive type is an n-type and a second conductive type is a p-type will be described as an example.

In the semiconductor device (MOSFET) 300 according to the present embodiment, a distance between a first void portion 20 and a second void portion 30 in a direction (direction A in FIG. 9) parallel to a surface of an n⁻-type semiconductor layer (first semiconductor layer) 12 is D. Further, a distance between an lower end of the first void portion 20 and a lower end of the second void portion 30 in a direction (direction B in FIG. 9) vertical to the surface of the n⁻-type semiconductor layer 12 is $d_1$, and a distance between an upper end of the first void portion 20 and an upper end of the second void portion 30 in the direction (direction B in FIG. 9) vertical to the surface of the first semiconductor layer 12 is $d_2$. In this case, the relationship of $d_1 \leq D$ and $d_2 \leq D$ is satisfied.

Figure 10:
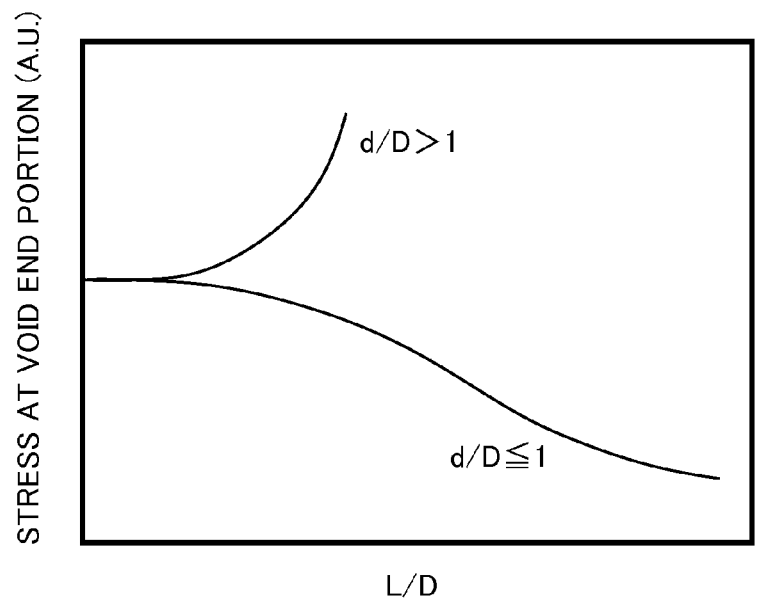
FIG. 10 is a view explaining a function and an effect according to the third embodiment.

FIG. 10 is a view for explaining a function and an effect of the semiconductor device according to the present embodiment.

A horizontal axis of a graph indicates a ratio of a length L of a void and a distance D between voids. A vertical axis of the graph indicates the stress of a void end portion. FIG. 10 illustrates that the ratio of the distance d between neighboring void end portions and the distance D between voids is higher than 1 (d/D>1) and that the ratio is 1 or less (d/D≤1).

The length L is, for example, $L_1$ in FIG. 9. The distance D is, for example, D in FIG. 9. Further, the distance d is, for example, $d_1$ or $d_2$ in FIG. 9.

As illustrated in FIG. 10, when the ratio of the distance d between the neighboring void end portions and the distance D between the voids is 1 or less (d/D≤1), the stress at the void end portion becomes small compared to when the ratio is higher than 1 (d/D>1). This is because the degree of concentration of the stress on the void end portion depends on d/D. When the stress at the void end portion is high, there is a concern that a defect such as dislocation is produced in crystal, and MOSFET characteristics deteriorate. Consequently, the MOSFET 300 which satisfies the relationship of $d_1 \leq D$ and $d_2 \leq D$ suppresses the stress at void end portions and achieves a MOSFET of stable characteristics.

According to the present embodiment, when a length of the first void portion 20 in a direction (direction B in FIG. 9) vertical to the surface of the n⁻-type semiconductor layer 12 is $L_1$, a relationship of $L_1 \geq D$ is desirably satisfied. As illustrated in FIG. 10, when the ratio of the distance d between neighboring void end portions and the distance D between voids is 1 or less (d/D≤1) and L/D is higher, a stress at a void end portion is less. This is because an interference effect between voids works to relax the stress. When L/D is 1 or more, that is, when L≥D holds, the stress at the void end portion becomes a sufficiently little stress to such a degree that a defect such as dislocation is not produced.

Although the case has been described with the above embodiments where the first conductive type is the n-type and the second conductive type is the p-type, a configuration where the first conductive type is the p-type and the second conductive type is the n-type can also be employed.

Further, although a case has been described with the embodiments as an example where the extending direction of the p-type semiconductor layer is the <110> and <100> directions, a configuration where the extending direction of the p-type semiconductor layer is another direction may also be employed.

Furthermore, although a MOSFET which adopts a SJ structure has been described with the embodiments as an example, the embodiments are also applicable to other semiconductor devices which adopt the SJ structures.

Still further, although single-crystal silicon as a semiconductor material has been described with the embodiments as an example, the embodiments are also applicable to other semiconductor materials such as germanium, diamond and gallium arsenide which adopt a diamond structure or a zinc blende structure. Furthermore, the embodiments are applicable to other crystal structures.

While certain embodiments have been described, these embodiments have been presented by way of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first conductive type first semiconductor layer;
   a second conductive type second semiconductor layer provided in the first semiconductor layer, the second semiconductor layer including a first lateral surface contacting the first semiconductor layer and a first bottom portion contacting the first semiconductor layer, the second semiconductor layer including a first void portion inside, the second semiconductor layer having a second conductive type impurity concentration decreasing from the first lateral surface and the first bottom portion toward the first void portion; and
   a second conductive type third semiconductor layer provided in the first semiconductor layer such that the first semiconductor layer is positioned between the third semiconductor layer and the second semiconductor layer, the third semiconductor layer including a second lateral surface contacting the first semiconductor layer and a second bottom portion contacting the first semiconductor layer, the third semiconductor layer including a second void portion inside, the third semiconductor layer having a second conductive type impurity concentration decreasing from the second lateral surface and the second bottom portion toward the second void portion.

2. The semiconductor device according to claim 1, wherein when a distance between the second semiconductor layer and the third semiconductor layer is $W_1$, a first conductive type impurity concentration of the first semiconductor layer is $N_1$, a distance from the first lateral surface to the first void portion is $W_2$, and the second conductive type impurity concentration of the second semiconductor layer is $N_2$, a following relationship is satisfied $$0.7 \leq W_1 N_1 / W_2 N_2 \leq 1.3.$$

3. The semiconductor device according to claim 1, wherein when a distance between the first void portion and the second void portion in a direction parallel to a surface of the first semiconductor layer is D, a distance between a lower end of the first void portion and a lower end of the second void portion in a direction vertical to the surface of the first semiconductor layer is $d_1$, and a distance between an upper end of the first void portion and an upper end of the second void portion in a direction vertical to the surface of the first semiconductor layer is $d_2$, a following relationship is satisfied $$d_1 \leq D, \text{ and } d_2 \leq D.$$

4. The semiconductor device according to claim 3, wherein when a length of the first void portion in the direction vertical to the surface of the first semiconductor layer is $L_1$, a following relationship is satisfied $$L_1 \geq D.$$

5. The semiconductor device according to claim 1, wherein a extending direction of the second semiconductor layer and the third semiconductor layer on a surface parallel to a surface of the first semiconductor layer is a <100> direction.

6. The semiconductor device according to claim 1, wherein
   in the second semiconductor layer, the second conductive type impurity concentration decreases one digit or more from the first lateral surface and the first bottom portion toward the first void portion, and
   in the third semiconductor layer, the second conductive type impurity concentration decreases one digit or more from the second lateral surface and the second bottom portion toward the second void portion.

7. The semiconductor device according to claim 1, wherein the second semiconductor layer and the third semiconductor layer include non-doped regions.

8. The semiconductor device according to claim 1, wherein the first semiconductor layer, the second semiconductor layer and the third semiconductor layer are single-crystal silicon.

9. The semiconductor device according to claim 1, further comprising:
   a first conductive type substrate provided on a side of the first semiconductor layer opposite to the second semiconductor layer and the third semiconductor layer, the substrate having a higher first conductive type impurity concentration than that of the first semiconductor layer;
   two second conductive type fourth semiconductor layers provided on a side of the second semiconductor layer and the third semiconductor layer opposite to the substrate and the first semiconductor layer, the fourth semiconductor layers sandwiching the first semiconductor layer therebetween;
   a first conductive type fifth semiconductor layer including higher first conductive type impurity concentration than that of the first semiconductor layer, each of the fourth semiconductor layers being sandwiched between the fifth semiconductor layer and the first semiconductor layer;
   a gate insulating film provided on the first semiconductor layer sandwiched between the fourth semiconductor layers;
   a gate electrode provided on the gate insulating film;
   a first electrode provided on the fifth semiconductor layer; and
   a second electrode provided on a side of the substrate opposite to the first semiconductor layer.

10. The semiconductor device according to claim 9, further comprising a second conductive type sixth semiconductor layer having higher second conductive type impurity concentration than those of the fourth semiconductor layers, the fourth semiconductor layers being sandwiched between the sixth semiconductor layer and the first semiconductor layer,
wherein the first electrode is provided on the sixth semiconductor layer.

* * * * *